(12) United States Patent
Lai et al.

(10) Patent No.: US 6,902,872 B2
(45) Date of Patent: Jun. 7, 2005

(54) METHOD OF FORMING A THROUGH-SUBSTRATE INTERCONNECT

(75) Inventors: Diane Lai, Corvallis, OR (US); Samson Berhane, Corvallis, OR (US); Barry C. Snyder, Bend, OR (US); Ronald A. Hellekson, Eugene, OR (US); Hubert Vander Plas, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/208,163

(22) Filed: Jul. 29, 2002

(65) Prior Publication Data

US 2004/0017419 A1 Jan. 29, 2004

(51) Int. Cl.[7] .................................................. G03F 7/00
(52) U.S. Cl. ...................... 430/322; 430/323; 430/324; 430/325; 347/54; 347/55; 216/27
(58) Field of Search ................................. 430/322–325, 430/311; 347/54–55; 216/27

(56) References Cited

U.S. PATENT DOCUMENTS

| | | |
|---|---|---|
| 3,903,427 A | 9/1975 | Pack ........................... 250/578 |
| 4,309,083 A | 1/1982 | Duchene et al. ............. 350/357 |
| 4,348,253 A | 9/1982 | Subbarao et al. ............ 154/643 |
| 4,445,978 A | 5/1984 | Whartenby et al. ........... 204/75 |
| 4,842,699 A | 6/1989 | Chan et al. |
| 4,961,821 A | 10/1990 | Drake et al. ................. 156/647 |
| 4,964,212 A | 10/1990 | Deroux-Dauphin et al. .. 29/852 |
| 5,037,782 A | 8/1991 | Nakamura et al. ........... 437/902 |
| 5,166,097 A | 11/1992 | Tanielian .................... 437/203 |
| 5,424,245 A | 6/1995 | Gurtler et al. |
| 5,425,816 A | 6/1995 | Cavicchi et al. ............. 136/256 |
| 5,599,744 A | 2/1997 | Koh et al. ................... 437/195 |
| 5,851,894 A | 12/1998 | Ramm ......................... 438/311 |
| 5,910,687 A * | 6/1999 | Chen et al. .................. 257/784 |
| 5,985,521 A | 11/1999 | Hirano et al. ................ 430/314 |
| 6,096,635 A | 8/2000 | Mou et al. ................... 438/637 |
| 6,110,825 A | 8/2000 | Mastromatteo et al. ..... 438/667 |
| 6,142,611 A * | 11/2000 | Pan .............................. 347/63 |
| 6,143,190 A | 11/2000 | Yagi et al. .................... 216/27 |
| 6,197,664 B1 | 3/2001 | Lee et al. .................... 438/466 |
| 6,221,769 B1 | 4/2001 | Dhong et al. ............... 438/584 |
| 6,294,402 B1 | 9/2001 | Lau et al. |
| 6,440,835 B1 * | 8/2002 | Lin ............................. 438/611 |
| 6,576,493 B1 * | 6/2003 | Lin et al. .................... 438/107 |
| 6,671,947 B2 * | 1/2004 | Bohr ........................... 29/846 |
| 2001/0027002 A1 | 10/2001 | Matsumoto ................. 438/569 |
| 2002/0018101 A1 | 2/2002 | Boyd et al. |
| 2004/0017419 A1 | 1/2004 | Lai et al. |

OTHER PUBLICATIONS

WO Search Report dated Aug. 6, 2004 for PCT/US03/29807 filed Sep. 17, 2003.
Kuhmann et al., "Through Wafer Interconnects and FlipChip Bonding: A Toolbox for Advanced Hybrid Technologies for MEMS," pp. 1–8.

* cited by examiner

Primary Examiner—John A. McPherson
Assistant Examiner—Kripa Sagar

(57) ABSTRACT

A method of manufacturing a microelectronics device is provided, wherein the microelectronics device is formed on a substrate having a frontside and a backside. The method comprises forming a circuit element on the frontside of the substrate from a plurality of layers deposited on the frontside of the substrate, wherein the plurality of layers includes an intermediate electrical contact layer, and forming an interconnect structure after forming the electrical contact layer. The interconnect structure includes a contact pad formed on the backside of the substrate, and a through-substrate interconnect in electrical communication with the contact pad, wherein the through-substrate interconnect extends from the backside of the substrate to the electrical contact layer.

38 Claims, 5 Drawing Sheets

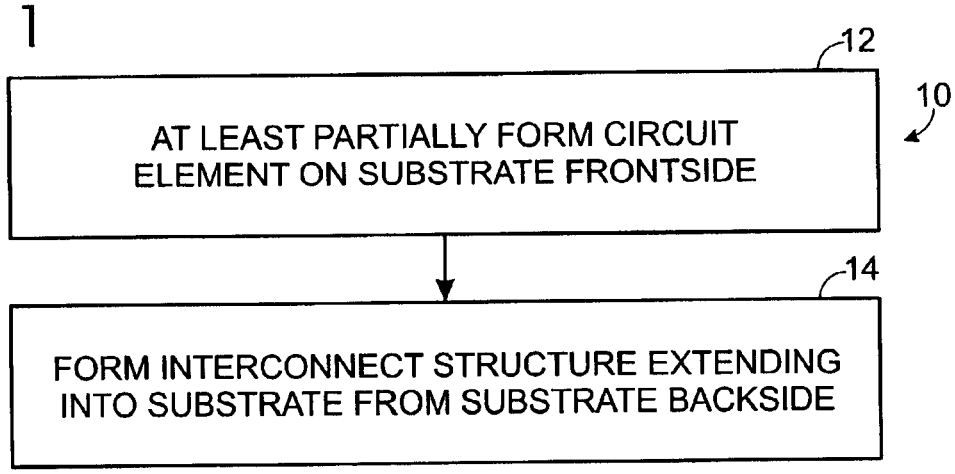
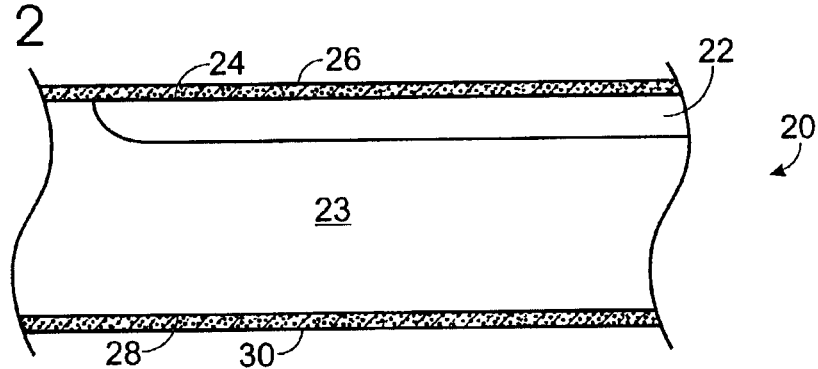
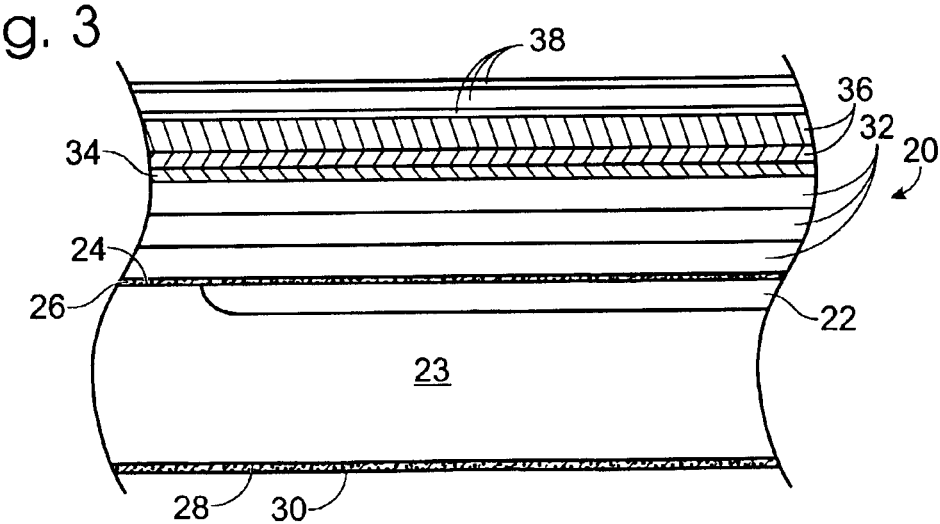

METHOD OF FORMING A THROUGH-SUBSTRATE INTERCONNECT

BACKGROUND OF THE INVENTION

As it becomes possible to fit more and more circuit elements onto a single substrate, a correspondingly larger number of interconnects may need to be fabricated on the substrate to connect the circuit elements to off-substrate circuitry. Conventional interconnects are typically formed on the same side of the substrate as the circuit elements (the "frontside" of the substrate), and terminate at contact pads formed around the perimeter of the frontside of the substrate. With each increase in the number of circuit elements on a single substrate, the contact pads and interconnects typically become more crowded around the perimeter of the substrate. This may require reducing the size of the interconnects to squeeze them into the available space. The reduced interconnect size may lead to a high interconnect resistance caused by the small cross-sectional area of the interconnects.

The interconnects that connect the firing mechanisms in a printhead die to external circuitry are typically formed on the same side of the substrate as the printing fluid nozzles. Thus, these interconnects may be exposed to printing fluids during printhead use, which may degrade or damage the interconnects. Continued exposure to the printing fluids may lead to the eventual failure of the printhead.

SUMMARY OF THE INVENTION

An embodiment of the present invention provides a method of manufacturing a microelectronics device, wherein the microelectronics device is formed on a substrate having a frontside and a backside. The method comprises forming a circuit element on the frontside of the substrate from a plurality of layers deposited on the frontside of the substrate, wherein the plurality of layers includes an intermediate electrical contact layer, and forming an interconnect structure after forming the electrical contact layer. The interconnect structure includes a contact pad formed on the backside of the substrate, and a through-substrate interconnect in electrical communication with the contact pad, wherein the through-substrate interconnect extends from the backside of the substrate to the electrical contact layer.

BRIEF DESCRIPTION OF THE DRAWINGS

FIG. 1 is a flow diagram of a method of forming a through-substrate interconnect according to a first embodiment of the present invention.

FIG. 2 is a sectional view of a substrate suitable for use with the embodiment of FIG. 1.

FIG. 3 is a sectional view of the substrate of FIG. 2, after forming a contact layer and a circuit element on the substrate frontside.

DETAILED DESCRIPTION

Figure 4:
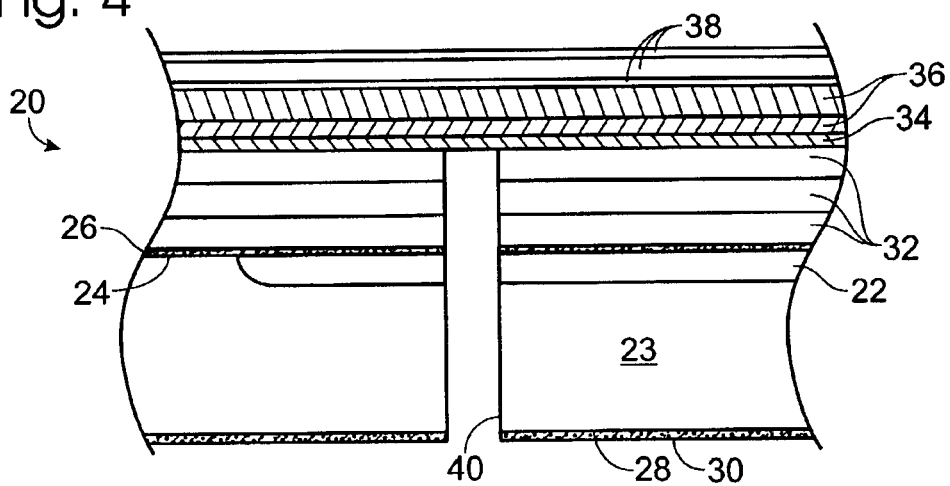
FIG. 4 is a sectional view of the substrate of FIG. 2, after forming a trench in the backside of the substrate that extends to the contact layer.

Embodiments of the present invention place the contact pads on the back of the substrate, and form interconnects that extend through the substrate to the contact pads. In this manner, a greater number of contacts may be formed on a single substrate without crowding. Furthermore, in the specific implementation of a die for an printhead, routing the interconnects through the substrate protects the interconnects from degradation by exposure to printing fluids. This may increase the lifetime of a printhead utilizing such a die.

A through-substrate interconnect formed in accordance with the present invention may also have other potential uses besides the connection of a circuit element on the front of a substrate to a contact pad on the back of the substrate. For example, the interconnects may also be used to connect circuit elements formed on the back of a substrate to circuit elements formed on the front of the substrate, and thus may allow circuit elements to be formed on both sides of a substrate. Furthermore, interconnects according to the present invention may find use in a wide variety of different types of microelectronics devices. Examples include, but are not limited to, actuating micro-mechanical devices located on the frontside of the substrate, arrays of sensors such as CCDs, biologically active detectors, electron emitters and optical switches.

Various methods of forming through-substrate interconnects have been proposed in the past. For example, some past methods involve the formation of through-holes, or holes that extend all the way through the substrate, as a step in the through-interconnect manufacturing process. However, this may interfere with the use of the substrate in some processing machines used in later processing steps, as some processing machines use a vacuum to hold a substrate during transport through or between processing stages. The presence of through-holes may allow air (or a processing gas) to pass through a substrate, and thus may make the substrates difficult to transport or hold during downstream processing steps. In contrast, the methods disclosed herein provide for the formation of the through-interconnect without the formation of a through-hole, and thereby allow substrates processed via the disclosed methods to be used with these processing machines.

FIG. 1 shows, generally at 10, a flow diagram of a first embodiment of a method of forming a through-substrate interconnect according to the present invention. The method first includes the general steps of at least partially forming, at 12, a circuit element on the substrate frontside. The circuit element is typically formed from a plurality of layers formed on the substrate frontside, and typically includes an electrical contact layer to which a through-substrate interconnect may be attached to form an electrical connection to the circuit element. The electrical contact layer is typically positioned in an intermediate location in the plurality of layers that form the circuit element. After forming the contact layer, method 10 next includes forming an interconnect structure at 14. The interconnect structure extends into the substrate from the backside of the substrate, and is formed in such a manner as to be in electrical communication with the electrical contact layer of the interconnect structure. Thus, the interconnect structure provides a path through the substrate through which current may flow to reach the circuit element. Furthermore, the interconnect structure is typically connected to a contact pad formed on the backside of the substrate, which is configured to be connected to a complementary connector on the circuit packaging. This allows the circuit element to be easily connected to off-substrate circuitry.

The general steps of method 10 may be performed in any of a number of different ways. A first implementation of method 10 is illustrated by FIGS. 2–12, which show cross-sectional views of a substrate 20 taken after performing selected steps of the implementation. First, FIG. 2 shows a substrate 20 to which some initial processing steps have been performed. Substrate 20 includes various structures created by the initial processing steps, such as a doped region 22 formed in the substrate bulk 23 adjacent the frontside 24 of the substrate, and a protective layer 26, typically an oxide or nitride layer, formed on the frontside of the substrate of the substrate. Furthermore, substrate 20 may also include a protective layer 30 formed on substrate backside 28. It will be appreciated that the initial structures shown on substrate 20 are merely exemplary, and that the substrate may have any other suitable structures formed from initial processing steps without departing from the scope of the present invention.

The fabrication of a circuit element on substrate 20 typically involves the selective deposition or formation of a plurality of layers on desired regions of substrate frontside 24. The number, nature, extent and composition of these layers may differ depending upon the circuit being fabricated. FIG. 3 shows an exemplary arrangement of a plurality of layers formed on substrate 20. The plurality of layers may include any number of layers, and may be formed form any suitable materials for constructing a desired circuit element. For example, one or more insulating layers 32 (three are shown here) may be deposited onto frontside 24 of substrate 20 to isolate electrically conducting layers positioned outside the view of FIGS. 2–12 from one another. Layers 32 may be made of any suitable material and may be formed in any desired manner.

At a later point in the device manufacturing process, typically during a "back end" process, a contact layer 34 is deposited on frontside 24 of substrate 20. Contact layer 34 is typically formed in such a manner as to be in contact with a circuit element located elsewhere on the substrate to deliver electric current to the circuit element. Contact layer 34 may be formed from any suitable electrically conductive material. Examples of suitable materials include, but are not limited to, copper, aluminum, tantalum, tungsten and gold. Similarly, contact layer 34 may be formed in any suitable manner. Examples of suitable methods of forming contact layer 34 include, but are not limited to, physical vapor deposition techniques such as sputtering, evaporation or other physical vapor deposition techniques, and various chemical vapor deposition techniques.

Once contact layer 34 has been formed, other layers are typically deposited onto contact layer 34. As with the layers formed below contact layer 34, any suitable number and types of layers of material may be deposited, or otherwise formed, over contact layer 34, depending upon the particular microelectronics device being constructed. FIG. 3 illustrates one exemplary arrangement of layers formed over contact layer 34. First, two electrically conducting layers 36 are formed over contact layer 34. Electrically conducting layers 36 are configured to carry current to circuit elements positioned elsewhere on substrate 20, and may carry current either to the same circuit element, or different circuit elements. Next, a plurality of insulating layers 38 are formed over electrically conducting layers 36. Insulating layers 38 electrically isolate electrically conducting layers 36, and also may protect circuitry formed on substrate 20 from damage. It will be appreciated that the depicted arrangement of electrically conducting layers 36 and insulating layers 38 is merely exemplary, and that any other suitable arrangement of layers may be used. Furthermore, it will be appreciated that electrically conducting layers 36 and insulating layers 38 may be made of any suitable materials, and may be deposited or otherwise formed in any suitable manner, without departing from the scope of the present invention.

After forming the circuit element represented by electrically conducting layers 36 and insulating layers 38, the through-substrate interconnect and contact pad are fabricated. One example of a suitable method for the fabrication of the through-substrate interconnect and contact pad is illustrated in FIGS. 4–12. First, as shown in FIG. 4, a trench 40 that extends from substrate backside 28 to the backside of electrical contact layer 34 is formed. Trench 40 may be formed via a wet etch process, a dry etch process, laser ablation, or any other suitable process. Because trench 40 is typically formed at a relatively late processing stage, it may be formed utilizing a low-temperature etching technique to avoid the degradation any temperature-sensitive layers deposited in earlier processing steps, or to avoid causing any unwanted diffusion of dopants, conductors, etc.

One of the advantages offered by the present invention is that the deposition of electrical contact layer 34 before the formation of trench 40 allows the use of chemically selective etching technique that etches substrate bulk 23 selectively over the electrical contact layer to stop the etching upon the reaching the electrical contact layer. This may allow the depth of trench 40 to be controlled without the need for extremely close monitoring of etching rates. The type of selective etching process used may be chosen based upon the physical and chemical properties of substrate bulk 23 and electrical contact layer 34. For example, where substrate bulk 23 is silicon and electrical contact layer 34 is metal, most conventional silicon etching techniques, wet or dry, substantially slow upon reaching the metal electrical contact layer.

Likewise, depending upon the chemical and physical properties of substrate bulk 23, backside protective layer 26, frontside protective layer 30 and insulating layers 32, two or more different etching chemistries may need to be used to etch completely through to the backside of electrical contact layer 34. Furthermore, substrate 10 may have a thin insulating layer 30 formed on the substrate backside, which also may be etched with a different etching chemistry. A masking may be used to cover portions of substrate 10 that are to be protected during the process or processes used to etch trench 40.

The shape and profile of the sides of trench 40 may be controlled by the selection of the etching process used to form the trench. For example, if it desired to form trench 40 with relatively straight sides, as depicted in FIG. 4, then a dry etching technique may be used. On the other hand, if it is desired to form trench 40 with more sloped sides, then a wet etching technique may be used. Furthermore, a step may be formed in the sides of trench 40 by using two (or more) separate masking steps when etching the trench to give the trench a middle, narrower section and a wider, bottom section (not shown). While the formation of trench 40 is described herein as occurring after the deposition of conducting layers 36 and insulating layers 38, it will be appreciated that the trench may be formed at any other suitable time after deposition of electrical contact layer 34 in the overall device fabrication process.

Figure 5:
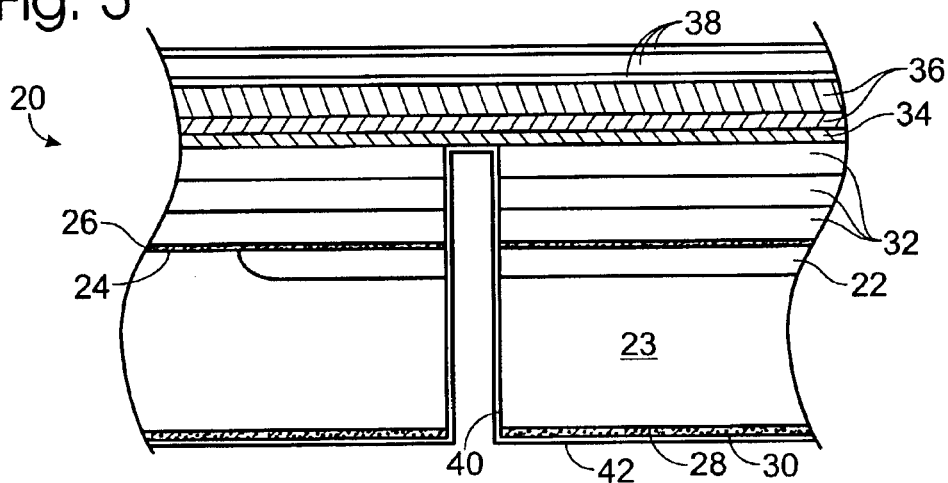
FIG. 5 is a sectional view of the substrate of FIG. 2, after forming a passivating layer on the surfaces of the trench and on the backside of the substrate.

After forming trench 40, a passivating layer 42 may be formed on the sides of the trench and on the substrate backside, as shown in FIG. 5. Passivating layer 42 is configured to electrically insulate electrically conductive material deposited in trench 40 from substrate bulk 23. Passivating layer 42 may be formed by any suitable method, including, but not limited to, plasma anodization, plasma nitridization, a combination of plasma anodization and plasma nitridization, and atomic layer deposition. Where plasma anodization and/or plasma nitridization are used, the passivating layer is typically formed from silicon oxide, silicon nitride and/or silicon oxynitride. In contrast, atomic layer deposition allows passivating layer 42 to be formed from a wider variety of materials, and thus may allow a passivating material to be selected for particular physical properties, such as its dielectric constant. Examples of materials that may be deposited using atomic layer deposition include, but are not limited to, tantalum oxide and aluminum oxide.

Atomic layer deposition results in the formation of extremely uniform and dense films, which may allow the use of a very thin passivating layer 42. For example, passivating layer 42 typically is subjected to an electrical potential of approximately forty volts. Atomic layer deposition allows films with a breakdown field of up to ten angstroms/volt to be formed, and thus may allow the use of a passivating layer with a thickness on the order of four hundred angstroms.

Figure 6:
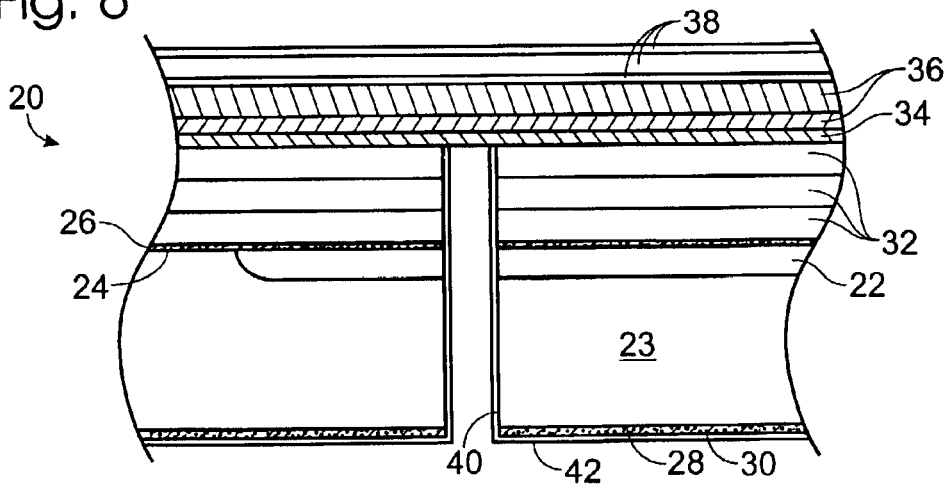
FIG. 6 is a sectional view of the substrate of FIG. 2, after removing the passivating layer from the bottom of the trench.
Figure 7:
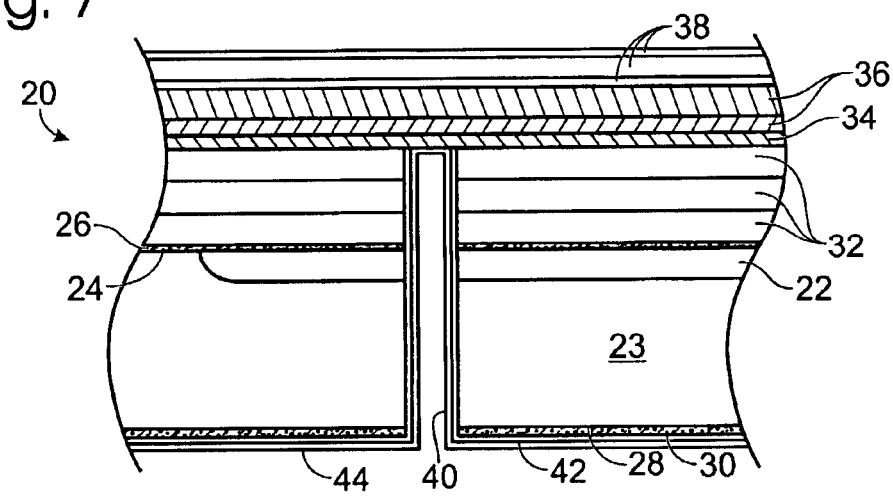
FIG. 7 is a sectional view of the substrate of FIG. 2, after depositing an adhesion layer on the surfaces of the trench and on the backside of the substrate.
Figure 8:
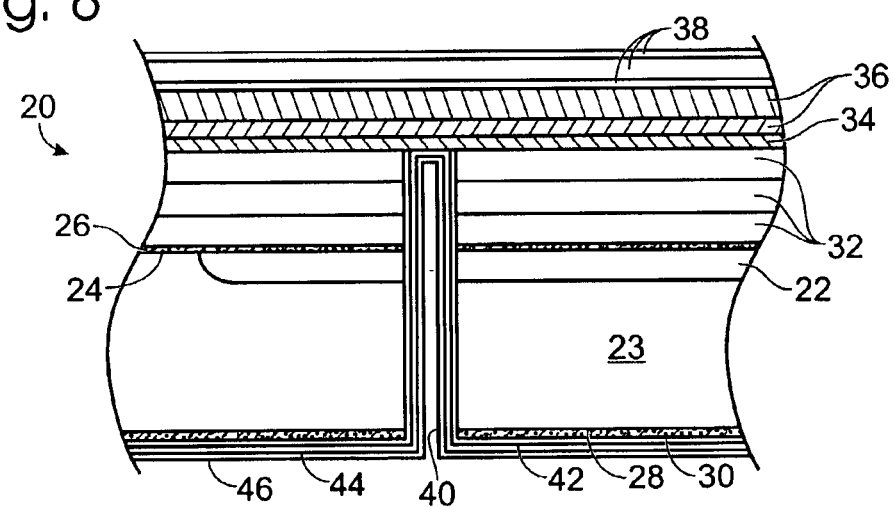
FIG. 8 is a sectional view of the substrate of FIG. 2, after depositing a seed layer on the surfaces of the trench and on the backside of the substrate.

Depending upon the process used to form passivating layer 42, the passivating layer may need to be removed from the bottom of trench 40 before an electrically conductive material is deposited in the trench. For example, where plasma anodization is used to create passivating layer 40, the process may not oxidize the backside of electrical contact layer 34 as rapidly as the sides of the trench, if at all. In this situation, passivating layer 42 may not need to be removed from the bottom of trench 40. However, other methods of forming passivating layer 42 may cause a sufficiently thick passivating layer to form at the bottom of trench 40 to require its removal from the bottom of the trench, as shown in FIG. 6. In this situation, passivating layer 42 may be removed from the bottom of trench via any suitable method. For example, a directional etch that selectively removes material oriented in the direction of the bottom of trench 40 to the relative exclusion of material oriented in the directions of the sides of the trench may be used. Alternatively, where passivating layer 42 is thinner at the bottom of trench 40 than on the sides of the trench, an isotropic etching process may be used.

After removing passivating layer 42 from the bottom of trench 40 (where desired), any other desired steps to ready substrate 20 for the deposition of an electrically conductive material in trench 40 may be performed. This preparation may involve several steps, depending upon the method used to deposit the electrically conductive material in trench 40. For example, an adhesion layer, indicated at 44 in FIG. 7, may be used to improve the adherence of the electrically conductive material to the walls of trench 40. Furthermore, where electroplating is used to deposit the electrically conductive material, a seed layer, indicated at 46 in FIG. 8, may be used to carry current for the electrodeposition process.

Any suitable material may be used for adhesion layer 44. Examples of suitable materials include those that adhere well both to seed layer 46 and to passivating layer 42. Where passivating layer 42 is formed from silicon oxide, suitable materials for adhesion layer 44 include, but are not limited to, tantalum and titanium. Likewise, adhesion layer 44 may be formed by any suitable method, examples of which include, but are not limited to, atomic layer deposition, physical vapor deposition and sputtering.

Seed layer 46 may also be made of any suitable material. Suitable materials include those that have the ability to carry a sufficient current for the electroplating process. Examples include, but are not limited to, copper and gold. If desired, seed layer 46 may be formed from the same material that is to be electroplated. Thus, where copper is to be deposited by electroplating, copper may also be used to form seed layer 46. Suitable methods of depositing seed layer 46 include, but are not limited to, atomic layer deposition, chemical vapor deposition, physical vapor deposition, self-ionized plasma (SIP) deposition, and sputtering.

Although FIGS. 7–19 show only a single trench 40 formed in substrate backside 28, a typical substrate will have more than one trench 40 formed in its backside, and may have a very large number of trenches 40, depending upon how many through-substrate interconnects are to be formed. Thus, to allow current to flow across the entire backside of substrate 20 to assist in the electroplating process, adhesion layer 44 and seed layer 46 may be deposited on backside 28 of substrate 20, as well as on the interior surfaces of trench 40.

Figure 9:
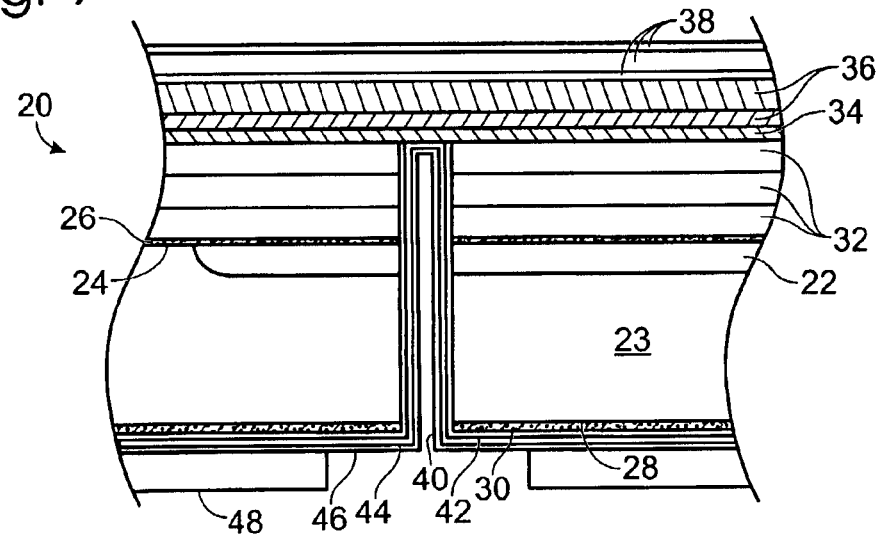
FIG. 9 is a sectional view of the substrate of FIG. 2, after depositing and patterning a layer of photoresist on the backside of the substrate.

A typical electroplating process is as follows. First, a layer of photoresist, shown at 48 in FIG. 9, is deposited and patterned to define the areas of substrate 20 that are to be electroplated. Next, a layer of an electrically conductive material is deposited to form an interconnect structure, indicated generally at 50 in FIG. 10. Interconnect structure 50 includes both a through-substrate portion 52 and a contact pad 54. Through-substrate portion 52 is formed from the electrodeposition of the conductive material in trench 40, and contact pad 54 is formed from the deposition of the conductive material on portions of the backside of the substrate that are not covered by layer of photoresist 48.

Figure 11:
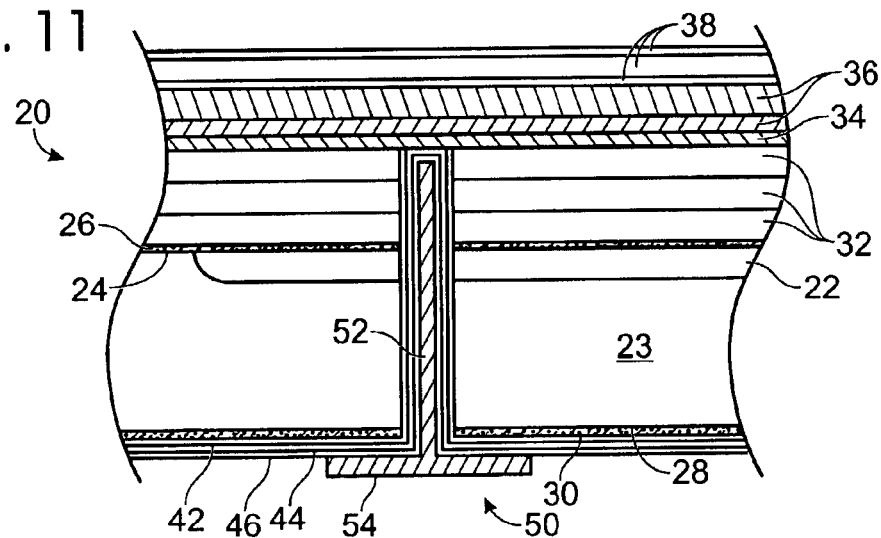
FIG. 11 is a sectional view of the substrate of FIG. 2, after removing the photoresist from the substrate backside.
Figure 12:
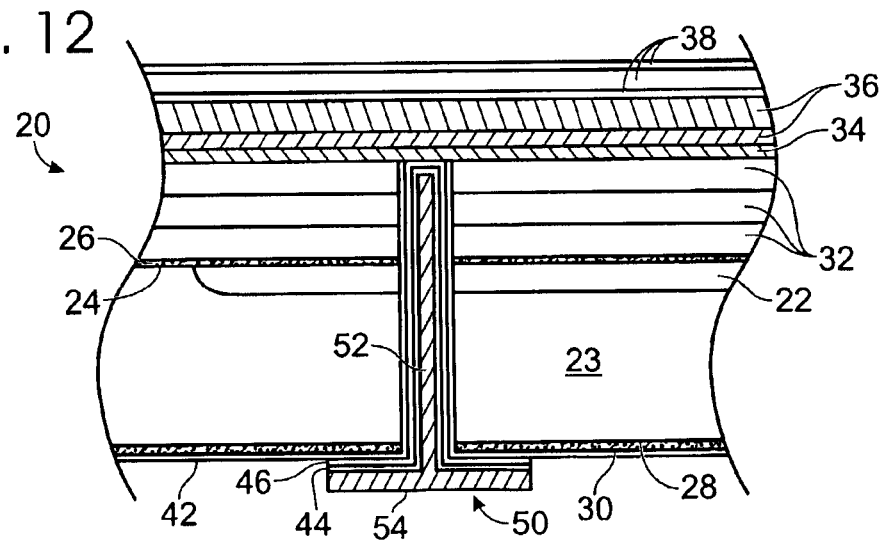
FIG. 12 is a sectional view of the substrate of FIG. 2, after removing the adhesion layer and seed layer from the spaces adjacent to the contact pad.

After forming interconnect structure 50, layer of photoresist 48 is stripped, leaving contact pad 54 defined on substrate backside 28, as shown in FIG. 11. Finally, the portions of seed layer 46 and adhesion layer 44 that are positioned on substrate backside 28 adjacent contact pad 54 are etched away (or otherwise removed) to electrically isolate contact pad 54 from other contact pads, as shown in FIG. 12. At this point, through-substrate portion 52 defines an electrically conductive path through substrate bulk 23, and connects contact pad 54 to any circuit elements connected to electrical contact layer 34, such as those formed by electrically conducting layers 36 and electrically insulating layers 38.

Figure 10:
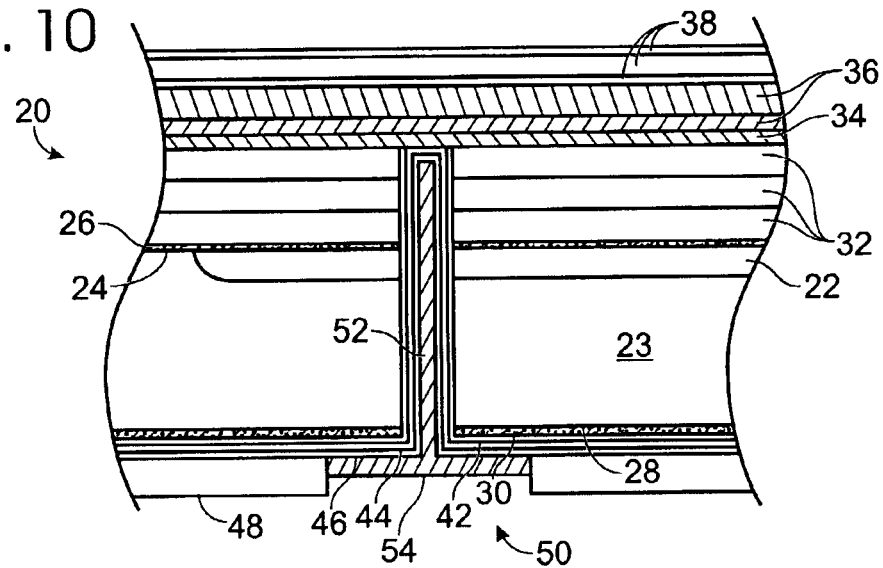
FIG. 10 is a sectional view of the substrate of FIG. 2, after forming a through-substrate interconnect and contact pad.
Figure 13:
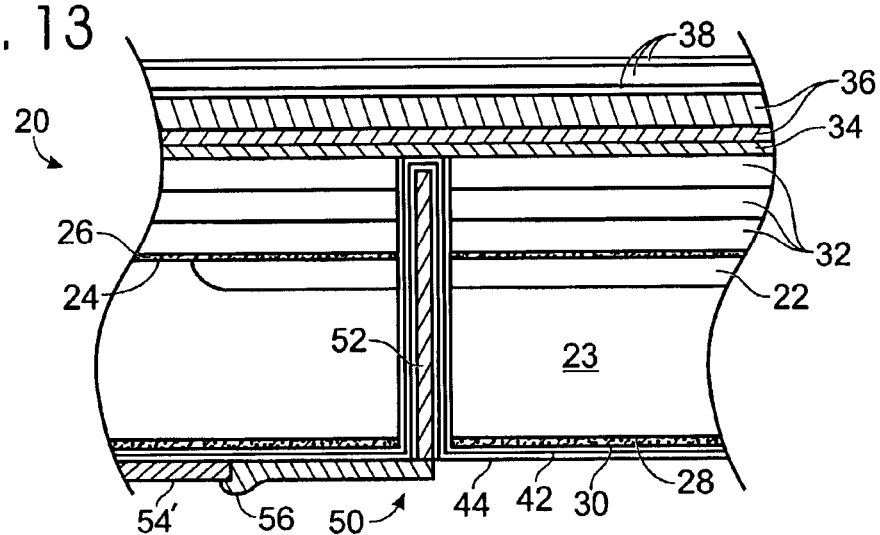
FIG. 13 is a sectional view of the substrate of FIG. 2, showing an alternate contact pad placement.
Figure 14:
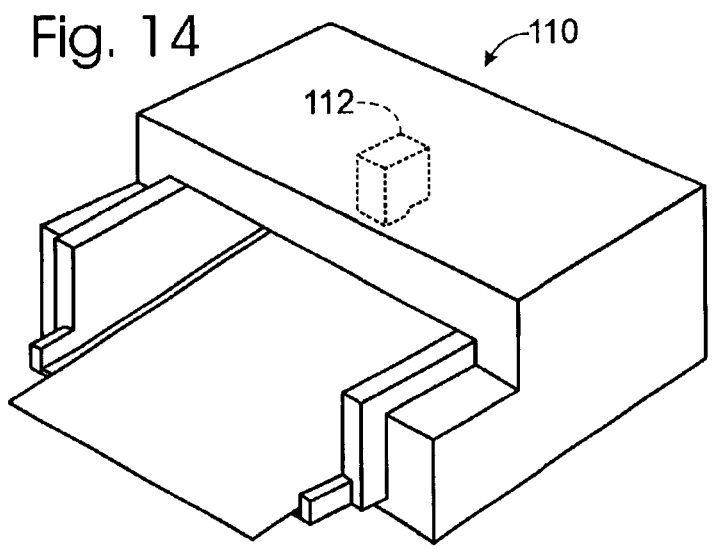
FIG. 14 is a perspective view of a printing device having a printhead according to another aspect of the present invention.

While contact pad 54 and through-substrate portion 52 are depicted as integral with one another in FIGS. 10–12, it will be appreciated that the contact pad may also be formed at a location on substrate backside 28 spaced from the terminus of through-substrate portion 52, as shown in FIG. 13 at 54'. In this configuration, a conductive trace 56 may be formed on substrate backside 28 to connect through-substrate portion 52 of the interconnect structure to contact pad 54'. This allows contact pad 54' to be formed in any desired location on substrate backside 28, and thus permits a great deal of freedom in the placement of the contact pads on the substrate backside.

A through-substrate interconnect constructed in accordance with the methods of the present invention may find uses in any of a number of different types of electronic devices. As mentioned above, some examples include mass storage devices, solid state memory devices, CCD arrays, biologically active detectors, electron emitter arrays, micromechanical devices, optical switches, and printheads for printing devices. An exemplary printing device is shown generally at 110 in FIG. 14, and a printhead is indicated schematically at 112. While printing device 110 is depicted as a desktop printer, it will be appreciated that a printhead constructed in accordance with the present invention may also be used in any other printing device, such as a fax machine or a copier. Furthermore, printing device 110 may be any desired size, large- or small-format.

Figure 15:
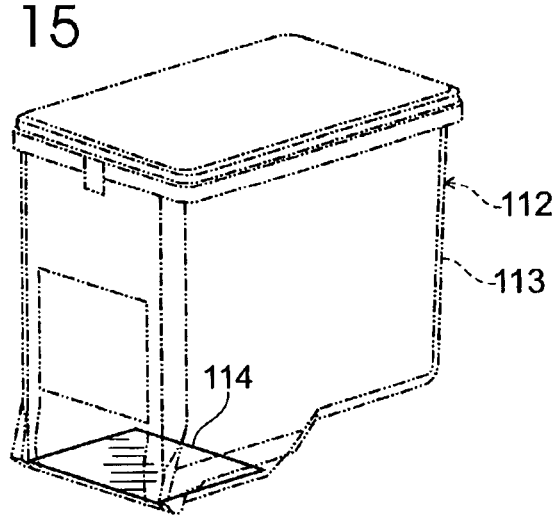
FIG. 15 is a perspective view of a substrate associated with the printhead of FIG. 14.

Referring next to FIG. 15, printhead 112 includes a body 113, and a substrate 114 on which a plurality of fluidic ejection mechanisms (not shown) are formed disposed on the body. Substrate 114 is positioned on body 113 in such a manner as to direct a printing fluid, such as an ink, ejected from the fluidic ejection devices onto a medium positioned beneath the printhead. As described above, the interconnects connecting the fluidic ejection mechanisms to external circuitry on conventional printheads typically are formed on the frontside of the substrate. Thus, the interconnects may be exposed to printing fluids that may degrade the interconnects over time. In contrast, because the interconnects of substrate 114 extend through the substrate to contact pads formed on the back of the substrate, the interconnects are not exposed to the printing fluids, and thus may have a longer lifetime. It will be appreciated that each fluid ejection mechanism may have its own through-substrate interconnect, or more than one fluid ejection mechanism may share a single interconnect.

The disclosure set forth above encompasses multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious and directed to one of the inventions. These claims may refer to "an" element or "a first" element or the equivalent thereof; such claims should be understood to include incorporation of one or more such elements, neither requiring nor excluding two or more such elements. Inventions embodied in other combinations and subcombinations of features, functions, elements, and/or properties may be claimed through amendment of the present claims or through presentation of new claims in this or a related application. Such claims, whether directed to a different invention or to the same invention, and whether broader, narrower, equal, or different in scope to the original claims, also are regarded as included within the subject matter of the inventions of the present disclosure.

What is claimed is:

1. A method of manufacturing a fluidic ejection device, wherein the fluidic ejection device includes a substrate having a frontside and a backside, the method comprising:
    forming a circuit element on the frontside of the substrate, wherein the circuit element is formed from a plurality of layers deposited on the frontside of the substrate, the plurality of layers including an intermediate electrical contact layer; and
    forming an interconnect structure extending into the backside of the substrate after forming the electrical contact layer, wherein the interconnect structure includes a contact pad formed on the substrate backside and a through-substrate interconnect in electrical communication with the contact pad, wherein the through-substrate interconnect includes a trench formed from the wafer backside to the electrical contact layer, wherein the trench is substantially full with an electrically conductive material, and wherein the through-substrate interconnect extends through the substrate to the electrical contact layer.

2. The method of claim 1, wherein forming the interconnect structure includes forming a trench in the substrate backside that extends from the substrate backside to the electrical contact layer.

3. The method of claim 2, wherein the trench is formed by etching.

4. The method of claim 3, wherein the trench is formed by dry etching.

5. The method of claim 3, wherein the trench is formed by a chemically selective etching process that selectively etches the substrate to the exclusion of the contact layer.

6. The method of claim 1, wherein the electrically conductive material is selected from the group consisting of copper and aluminum.

7. The method of claim 1, further comprising forming a passivating layer in the trench before depositing the electrically conductive layer in the trench.

8. The method of claim 7, wherein the passivating layer includes at least one material selected from the group consisting of silicon oxide, silicon nitride, silicon oxynitride, tantalum oxide and aluminum oxide.

9. The method of claim 7, wherein the passivating layer is formed by a method selected from the group consisting of atomic layer deposition, plasma nitridization, plasma anodization, and combinations thereof.

10. The method of claim 1, wherein the electrically conductive material is deposited by electroplating.

11. The method of claim 1, wherein the contact pad is formed by the same process that deposits the electrically conductive material in the trench.

12. The method of claim 10, further comprising forming a seed layer in the trench before depositing the electrically conductive material by electroplating.

13. The method of claim 12, wherein the seed layer is formed by a method selected from the group consisting of atomic layer deposition and self-ionized plasma deposition.

14. The method of claim 12, wherein the seed layer is formed from the same electrically conductive material that is deposited in the trench.

15. The method of claim 1, further comprising depositing an adhesion layer in the trench before depositing the electrically conductive material in the trench.

16. The method of claim 15, wherein the adhesion layer is formed from a material selected from the group consisting of tantalum and titanium.

17. The method of claim 15, wherein the adhesion layer is formed by atomic layer deposition.

18. The method of claim 1, wherein the contact pad and the through-substrate interconnect are integral.

19. The method of claim 1, the through-substrate interconnect having a terminus at the backside of the substrate, wherein the contact pad disposed on the backside of the substrate at a location spaced from the terminus of the through-substrate interconnect.

20. A method of forming a through-substrate interconnect for a microelectronics device, the microelectronics device including a substrate having a frontside and a backside, the method comprising:

forming an electrical contact on the substrate frontside, wherein the electrical contact is in electrical communication with a circuit element formed on the substrate, the electrical contact having a backside;

forming a trench from the backside of the substrate extending to the backside of the electrical contact; and filling the trench with an electrically conductive material to form an electrically conductive pathway through the trench to the electrical contact.

21. The method of claim 20, further comprising at least partially forming the circuit element after forming the electrical contact but before forming the trench.

22. The method of claim 21, wherein the electrical contact is covered by other layers before the trench is formed.

23. The method of claim 20, further comprising forming a contact pad on the backside of the substrate, wherein the contact pad is in electrical communication with the electrically conductive material deposited in the trench.

24. The method of claim 20, wherein the contact pad and the electrically conductive pathway are formed in a single electroplating step.

25. The method of claim 20, wherein the trench is formed by dry etching.

26. The method of claim 25, wherein the trench is formed by a chemically selective dry etch process that substantially slows upon reaching the electrical contact.

27. The method of claim 20, further comprising forming a passivating layer in the trench before depositing the electrically conductive material in the trench.

28. The method of claim 20, the trench having a bottom, further comprising removing the passivating layer from the bottom of the trench before depositing the electrically conductive material in the trench.

29. The method of claim 20, wherein the electrically conductive material is deposited by electroplating.

30. The method of claim 20, further comprising forming a seed layer in the trench before depositing the electrically conducting material in the trench, wherein the seed layer is configured to carry current during electroplating.

31. The method of claim 20, the trench having sides, further comprising depositing an adhesion layer in the trench before depositing the electrically conductive material in the trench, wherein the adhesion layer is configured to improve the adhesion of the electrically conductive material to the sides of the trench.

32. A method of manufacturing a microelectronics device, wherein the microelectronics device is formed on a substrate having a frontside and a backside, the method comprising:

forming a circuit element on the frontside of the substrate, wherein the circuit element is formed from a plurality of layers deposited on the frontside of the substrate, the plurality of layers including an intermediate electrical contact layer; and forming an interconnect structure extending into the backside of the substrate to the electrical contact layer, wherein the interconnect structure includes a trench extending from the substrate backside to the electrical contact layer, and wherein the trench is filled with an electrically conductive material.

33. The method of claim 32, wherein forming an interconnect structure includes a step for forming a trench in the backside of the substrate after at least partially forming the circuit element.

34. The method of claim 33, wherein forming an interconnect structure includes a step for depositing an electrically conductive material in the trench.

35. The method of claim 33, wherein forming an interconnect structure includes a step for forming a passivating layer in the trench.

36. The method of claim 33, wherein forming an interconnect structure includes a step for forming an adhesion layer in the trench.

37. The method of claim 33, wherein forming an interconnect structure includes a step for forming a seed layer for depositing the electrically conductive material in the trench by electroplating.

38. The method of claim 32, wherein forming an interconnect structure includes a step for forming a contact pad on the backside of the substrate.

* * * * *